(12) United States Patent
Liu et al.

(10) Patent No.: US 11,728,335 B2
(45) Date of Patent: Aug. 15, 2023

(54) BURIED CHANNEL STRUCTURE INTEGRATED WITH NON-PLANAR STRUCTURES

(71) Applicant: Intel Corporation, Santa Clara, CA (US)

(72) Inventors: Guannan Liu, Portland, OR (US); Akm A. Ahsan, Portland, OR (US); Mark Armstrong, Portland, OR (US); Bernhard Sell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1042 days.

(21) Appl. No.: 16/257,855

(22) Filed: Jan. 25, 2019

(65) Prior Publication Data

US 2020/0243517 A1    Jul. 30, 2020

(51) Int. Cl.
*H01L 27/07* (2006.01)
*H01L 29/78* (2006.01)
(Continued)

(52) U.S. Cl.
CPC .. *H01L 27/0705* (2013.01); *H01L 21/823412* (2013.01); *H01L 21/823431* (2013.01);
(Continued)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 27/0705; H01L 27/0922; H01L 27/0928; H01L 29/4236; H01L 29/42376; H01L 29/42384; H01L 21/28114; H01L 21/823437; H01L 21/823828; H01L 21/823456; H01L 21/82385; H01L 21/823412; H01L 21/823807; H01L 21/823418; H01L 21/823814; H01L 29/0847; H01L 29/7848; H01L 29/66636
See application file for complete search history.

(56) References Cited

U.S. PATENT DOCUMENTS 7,501,674 B2 * 3/2009 Lee ............... H01L 29/7851
257/349
7,719,043 B2 * 5/2010 Yamagami ...... H01L 21/823807
438/176

(Continued)

*Primary Examiner* — Younes Boulghassoul
(74) *Attorney, Agent, or Firm* — Schwabe, Williamson & Wyatt, P.C.

(57) ABSTRACT

Embodiments of the disclosure are in the field of advanced integrated circuit structure fabrication and, in particular, buried channel structures integrated with non-planar structures. In an example, an integrated circuit structure includes a first fin structure and a second fin structure above a substrate. A gate structure is on a portion of the substrate directly between the first fin structure and the second fin structure. A source region is in the first fin structure. A drain region is in the second fin structure.

21 Claims, 18 Drawing Sheets

(51) Int. Cl.
*H01L 29/66* (2006.01)
*H01L 29/16* (2006.01)
*H01L 29/08* (2006.01)
*H01L 27/088* (2006.01)
*H01L 21/8234* (2006.01)

(52) U.S. Cl.
CPC ........ *H01L 21/823437* (2013.01); *H01L 21/823456* (2013.01); *H01L 21/823468* (2013.01); *H01L 27/0886* (2013.01); *H01L 29/0847* (2013.01); *H01L 29/16* (2013.01); *H01L 29/66545* (2013.01); *H01L 29/66795* (2013.01); *H01L 29/785* (2013.01)

(56) References Cited

U.S. PATENT DOCUMENTS

| | | | | |
|---|---|---|---|---|
| 7,932,564 | B2* | 4/2011 | Goto | H01L 21/823462 |
| | | | | 257/E27.06 |
| 9,276,088 | B1* | 3/2016 | Singh | H01L 21/823431 |
| 9,607,898 | B1* | 3/2017 | Cheng | H01L 21/823431 |
| 10,332,881 | B1* | 6/2019 | Badaroglu | H01L 29/0649 |
| 2011/0278662 | A1* | 11/2011 | Park | H01L 29/66628 |
| | | | | 257/330 |
| 2013/0313610 | A1* | 11/2013 | Sell | H01L 29/165 |
| | | | | 257/192 |
| 2016/0104701 | A1* | 4/2016 | Yoo | H01L 23/535 |
| | | | | 257/401 |
| 2017/0025533 | A1* | 1/2017 | Phoa | H01L 27/0886 |
| 2019/0057905 | A1* | 2/2019 | Chen | H01L 21/3086 |
| 2019/0348527 | A1* | 11/2019 | Liaw | H01L 21/823412 |

* cited by examiner

BURIED CHANNEL STRUCTURE INTEGRATED WITH NON-PLANAR STRUCTURES

TECHNICAL FIELD

Embodiments of the disclosure are in the field of advanced integrated circuit structure fabrication and, in particular, buried channel structures integrated with non-planar structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
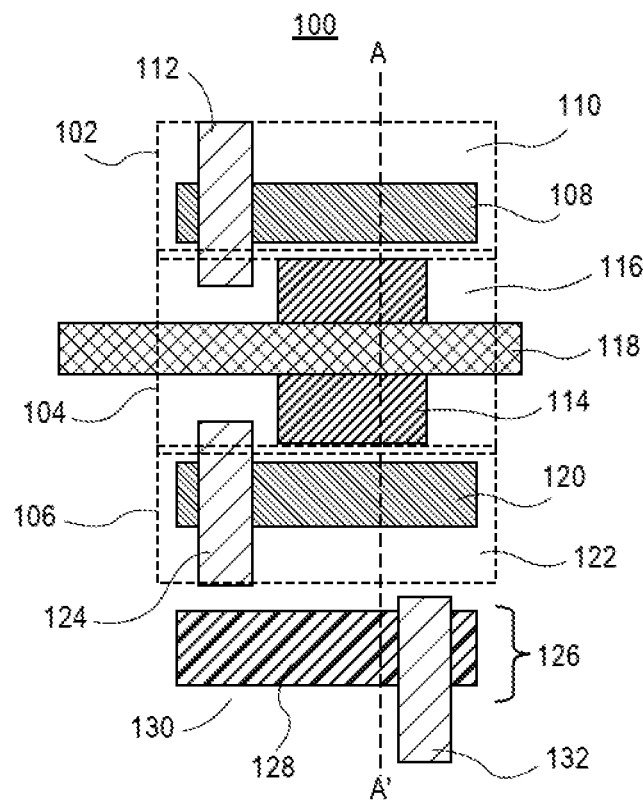
FIG. 1A illustrates a plan layout of an integrated circuit structure including a buried channel structure integrated with non-planar structures, in accordance with an embodiment of the present disclosure.

Advanced integrated circuit structure fabrication is described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following Detailed Description This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to the integration of planar buried channel devices in FinFET or other non-planar technology schemes.

To provide context, high surface scattering may be associated with FinFET devices. Previous solutions to reduce high surface scattering include the use of a relatively thicker gate oxide and/or relatively longer annealing times to reduce interface states. However, drawbacks to such approaches include the possibility of significant drive current degradation in FinFET transistors using a relatively thicker gate oxide causes. Longer annealing times may cause degradation in junction doping profile and cause short channel effects.

In accordance with an embodiment of the present disclosure, a planar buried channel device is integrated with FinFET devices. In one embodiment, an integration scheme involves the introduction of selective implants prior to poly/gate patterning.

Advantages of implementing one or more of the embodiments described herein may include one or more of: (1) buried-channel devices exhibit higher mobility which enhance drive current and product performance, (2) buried-channel devices offer low flicker noise and exhibit improved reliability performances which can exceed customer requirements for system-on chip (SoC) products, (3) process flows described herein may enable the fabrication of high breakdown voltage devices (i.e., extended drain MOSFET) with an extended well as a drain region.

Figure 1B:
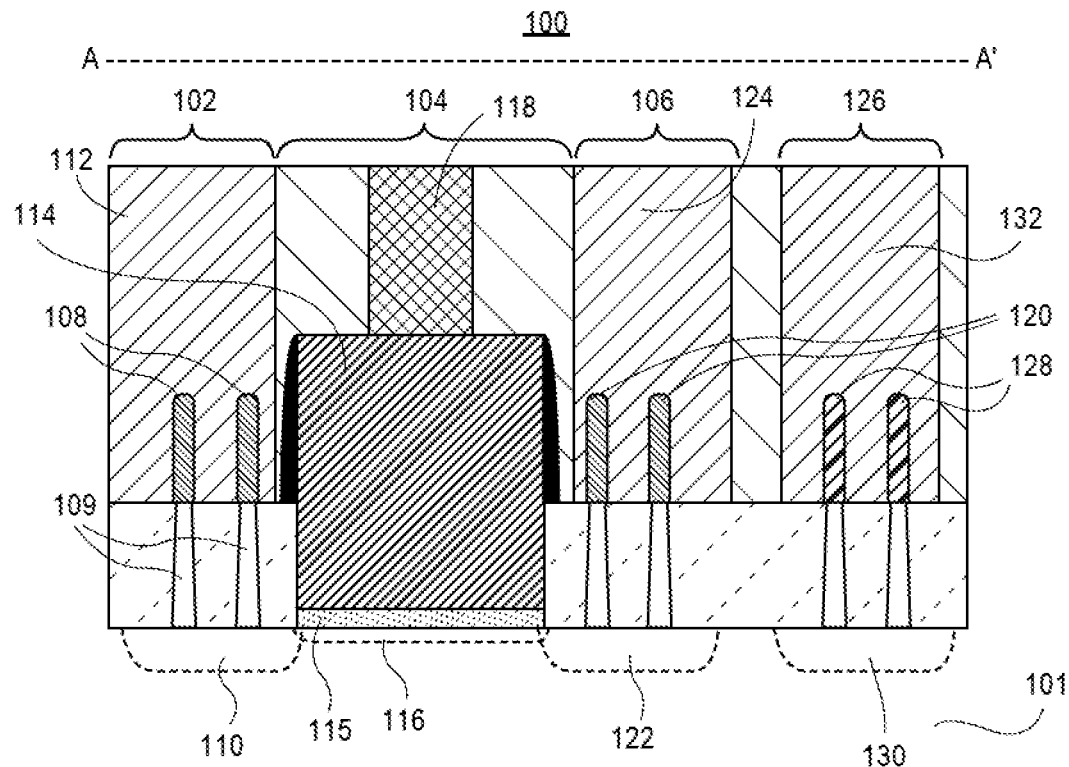
FIG. 1B illustrates a cross-sectional view of the integrated circuit structure of FIG. 1A, as taken along the A-A' axis, in accordance with an embodiment of the present disclosure.

As an example of a buried channel FinFET transistor, FIG. 1A illustrates a plan layout of an integrated circuit structure including a buried channel structure integrated with non-planar structures, in accordance with an embodiment of the present disclosure. FIG. 1B illustrates a cross-sectional view of the integrated circuit structure of FIG. 1A, as taken along the A-A' axis, in accordance with an embodiment of the present disclosure.

Referring to FIGS. 1A and 1B, an integrated circuit structure 100 includes a source location 102, a gate location 104, and a drain location 106. Source location 102 includes a source region 108 over a well region 110 above a substrate 101. In an embodiment, although shown as a single region in the plan layout, the source region 108 includes one or more isolated fin structures 109, such as two fin structures 109 as is depicted. In an embodiment, the source region 108 and well region 110 are of a same conductivity type, such as N-type. A conductive source contact 112, such as a trench contact, may be included over the source region 108, as is depicted.

Gate location 104 includes a gate structure including a gate electrode 114 and a gate dielectric 115, such as a metal gate electrode and a high-k gate dielectric. In an embodiment, the gate structure is on a buried doped region 116, as is depicted. In one embodiment, the buried doped region 116 is of a same conductivity type as the source region 108 and well region 110, such as N-type. A conductive gate contact 118 may be included over the gate electrode 114, as is depicted.

Drain location 106 includes a drain region 120 over a well region 122. In an embodiment, although shown as a single region in the plan layout, the drain region 120 includes one or more isolated fin structures 109, such as two fin structures 109 as is depicted. In an embodiment, the drain region 120 and well region 122 are of a same conductivity type, such as N-type. A conductive drain contact 124, such as a trench contact, may be included over the drain region 120, as is depicted.

Referring again to FIGS. 1A and 1B, in an embodiment, integrated circuit structure 100 further includes a tap location 126. Tap location 126 includes a diffusion region 128 over a well region 130. In an embodiment, although shown as a single region in the plan layout, the diffusion region 128 includes one or more isolated fin structures 109, such as two fin structures 109 as is depicted. In an embodiment, the diffusion region 128 and well region 130 are of a same conductivity type, such as P-type, and is of opposite conductivity type as compared to the source region 108 and drain region 120. A conductive tap contact 132, such as a trench contact, may be included over the diffusion region 128, as is depicted.

With reference again to FIGS. 1A and 1B, in accordance with an embodiment of the present disclosure, an integrated circuit structure 100 includes a first fin structure (109 left of 114) and a second fin structure (109 right of 114) above a substrate 101. A gate structure 114/115 is on a portion of the substrate 101 directly between the first fin structure (109 left of 114) and the second fin structure (109 right of 114). A source region 108 is in the first fin structure (109 left of 114). A drain region 120 is in the second fin structure (109 right of 114).

In an embodiment, the first fin structure includes a first pair of silicon fins (pair of 109s left of 114), and the second fin structure includes a second pair of silicon fins (pair of 109s right of 114). In an embodiment, the first fin structure is over a first well region 110 in the substrate 101, and the second fin structure is over a second well region 122 in the substrate 101.

In an embodiment, the gate structure 114/115 is over a buried doped region 116 in the substrate 101. In one embodiment, the first well region 110, the second well region 122, and the buried doped region 116 have an N-type conductivity.

In an embodiment, the integrated circuit structure 100 further includes a third fin structure (109 in region 126) above the substrate 101, the third fin structure (109 in region 126) adjacent the second fin structure (109 in region 106). In one embodiment, the third fin structure includes a pair of silicon fins (far right pair of 109s). In one embodiment, the third fin structure is over a well region 130 in the substrate 101, the well region 130 having a P-type conductivity. In one embodiment, the integrated circuit structure further includes a tap diffusion region 128 in the third fin structure.

As an exemplary process flow/integration scheme for a buried channel planar device integrated into FinFET technology, FIGS. 2A-2H illustrate cross-sectional views representing various operations in a method of fabricating an integrated circuit structure including a buried channel integrated circuit structure together with a non-planar integrated circuit structure, in accordance with an embodiment of the present disclosure. FIG. 3 illustrates a cross-sectional view of an integrated circuit structure including a buried channel integrated circuit structure together with a non-planar integrated circuit structure, in accordance with an embodiment of the present disclosure.

Figure 2A:
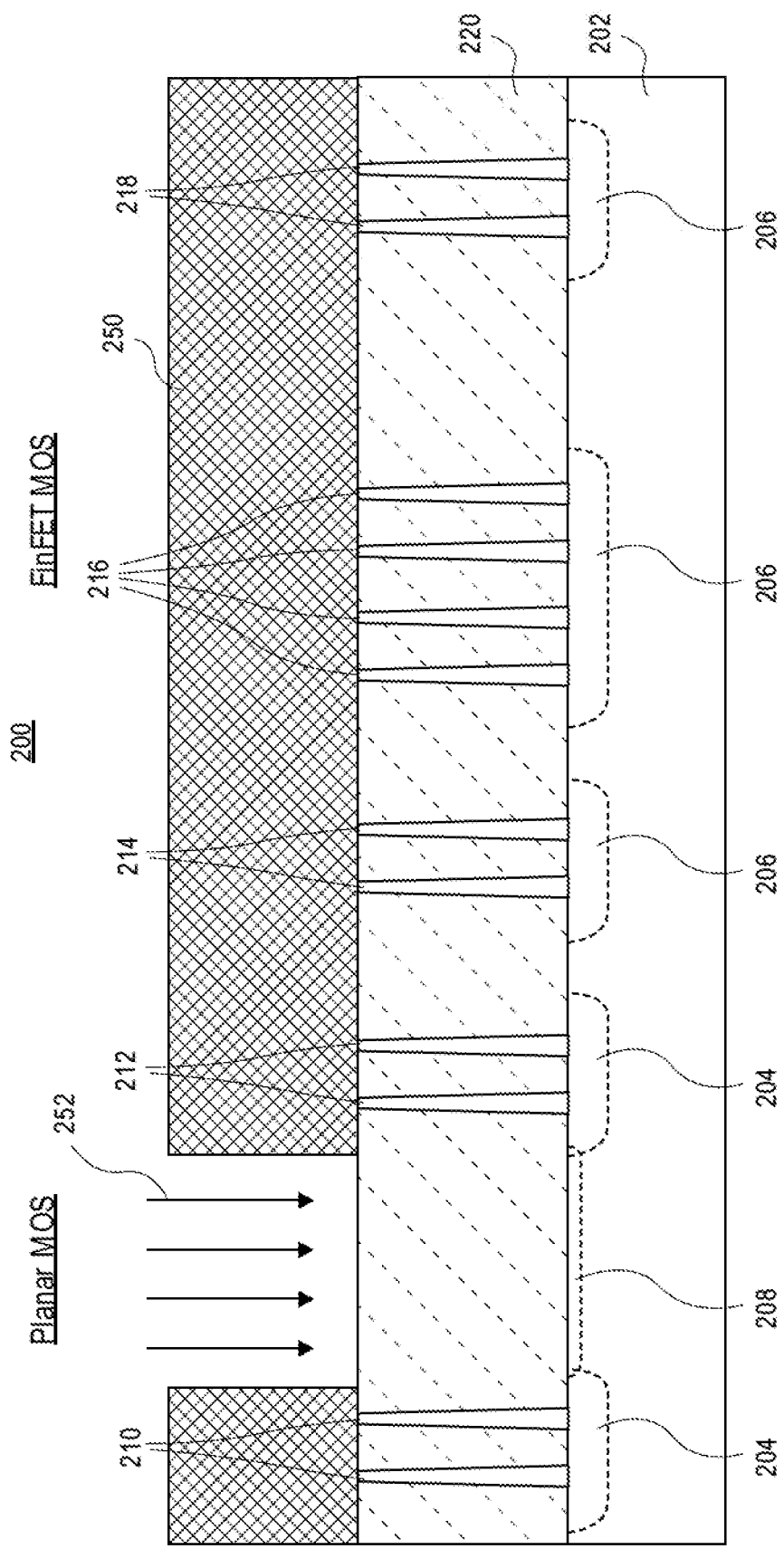
FIGS. 2A-2H illustrate cross-sectional views representing various operations in a method of fabricating an integrated circuit structure including a buried channel integrated circuit structure together with a non-planar integrated circuit structure, in accordance with an embodiment of the present disclosure.
Figure 3:
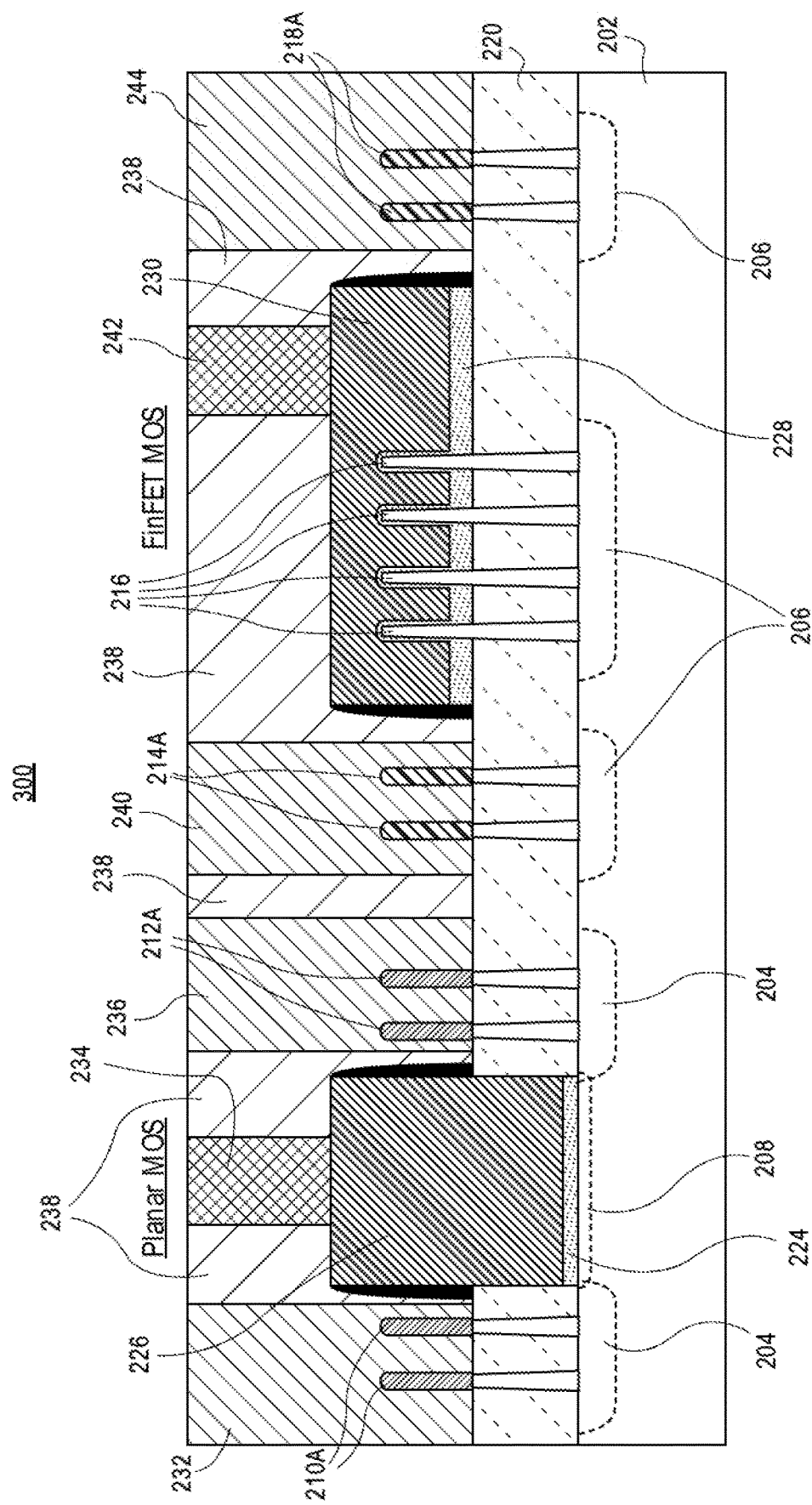
FIG. 3 illustrates a cross-sectional view of an integrated circuit structure including a buried channel integrated circuit structure together with a non-planar integrated circuit structure, in accordance with an embodiment of the present disclosure.

Referring to FIG. 2A, a starting structure 200 includes a planar MOS location and a non-planar MOS location on a common substrate 202. First wells 204 of a first conductivity type, such as N-type, are formed in common substrate 202. Second wells 206 of a second conductivity type, such as P-type, are also formed in common substrate 202. Various pluralities of fins 210, 212, 214, 216, and 218 are over the first wells 204 and second wells 206. It is to be appreciated that the particular number of fins within a plurality of fins may vary and that the number of fins depicted in FIG. 2A is merely one illustrative embodiment. A dielectric layer 220 is between the pluralities of fins 210, 212, 214, 216, and 218.

Referring again to FIG. 2A, in an embodiment, a buried doped region 208 is fabricated in a location where a planar buried channel device is ultimately formed. In one such, embodiment, a mask layer 250 is formed to have an opening revealing a gate location of a buried channel device. Dopant impurity atoms are implanted 252 through the opening to form buried doped region 208. In one embodiment, the conductivity type of the dopant impurity atoms is the same as the conductivity type of the first wells 204, such as N-type.

Figure 2B:
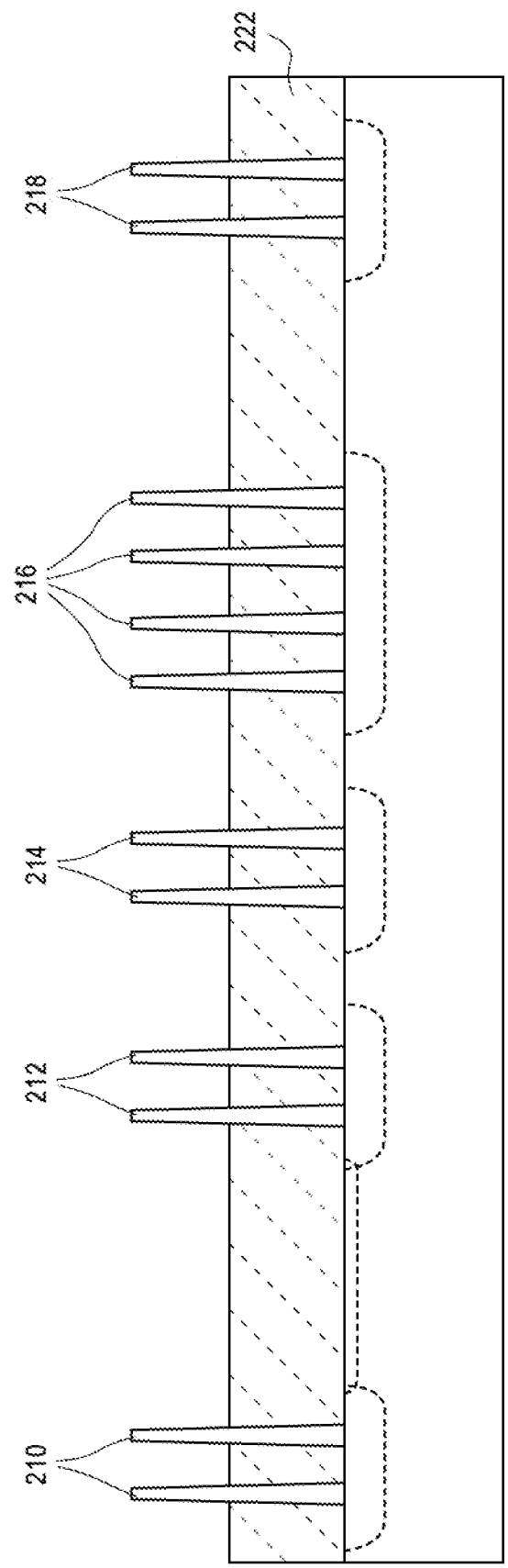

Referring to FIG. 2B, the mask layer 250 is removed. The dielectric layer 220 is recessed to formed recessed dielectric layer 222. Recessed dielectric layer 222 has an upper surface below the tops of the pluralities of fins 210, 212, 214, 216, and 218 to expose upper fin portions and to define sub-fin portions.

Figure 2C:
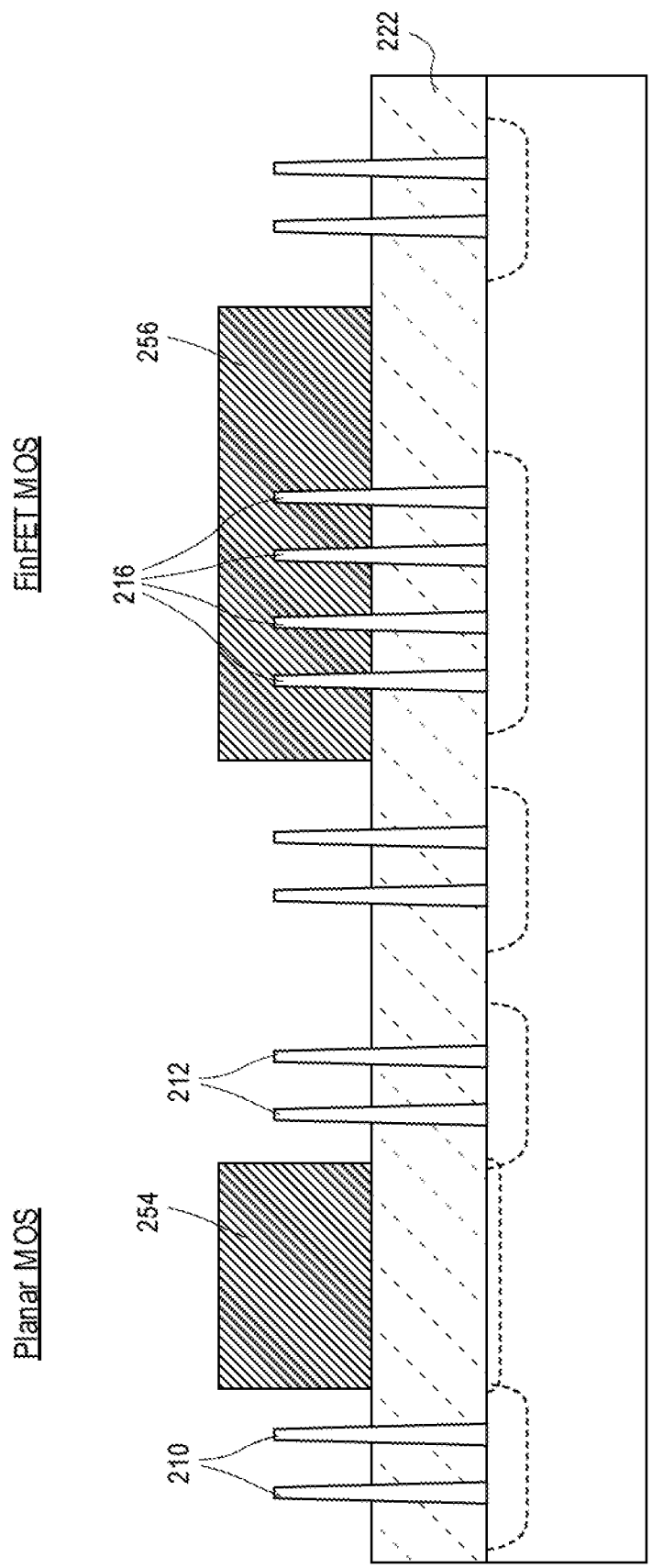

Referring to FIGS. 2C, a planar dummy gate structure 254 is formed between plurality of fins 210 and plurality of fins 212 and, if present, over buried doped region 208. A non-planar dummy gate structure 256 is formed over plurality of fins 216.

Figure 2D:
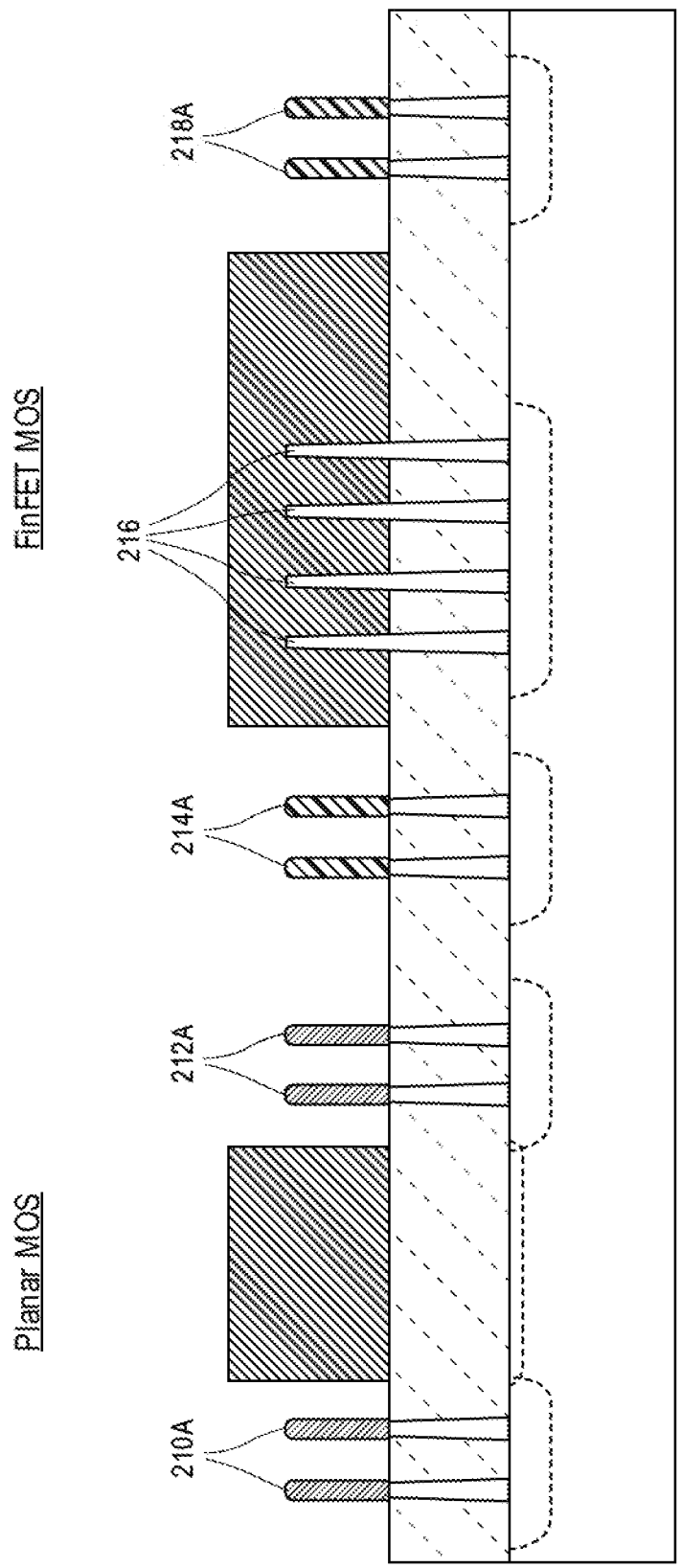

Referring to FIG. 2D, diffusion regions are formed in the exposed pluralities of fins, e.g., in pluralities of fins 210, 212, 214, and 218, but not in plurality of fins 216. In an embodiment, diffusion regions 210A and 212A are of the first conductivity type, such as N-type. Diffusion regions 214A and 218A are of the second conductivity type, such as P-type. In an embodiment, the diffusion regions are formed by implanting dopant impurity atoms into the upper fin portions. In another embodiment, the diffusion regions are formed by replacing the corresponding upper fin portions with the diffusion material, e.g., by etching and subsequent epitaxial growth. In the latter case, the diffusion material may be grown as isolated between adjacent fins within a plurality of fins (as shown), or may be merged between adjacent fins within a plurality of fins.

Figure 2E:
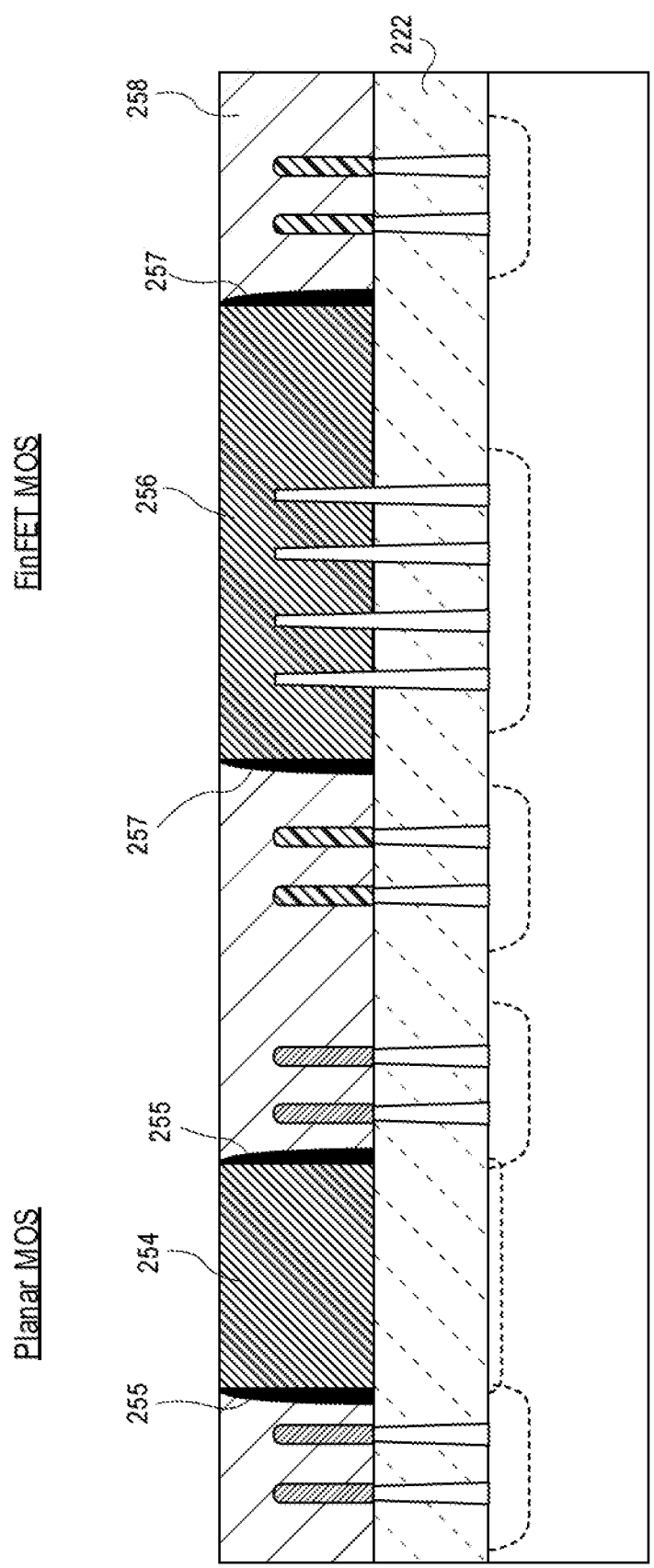

Referring to FIG. 2E, dielectric spacers 255 are formed along sidewalls of planar dummy gate structure 254. Dielectric spacers 257 are formed along sidewalls of non-planar dummy gate structure 256. An inter-layer dielectric layer 258 is formed adjacent the planar dummy gate structure 254 and the non-planar dummy gate structure 256.

Figure 2F:
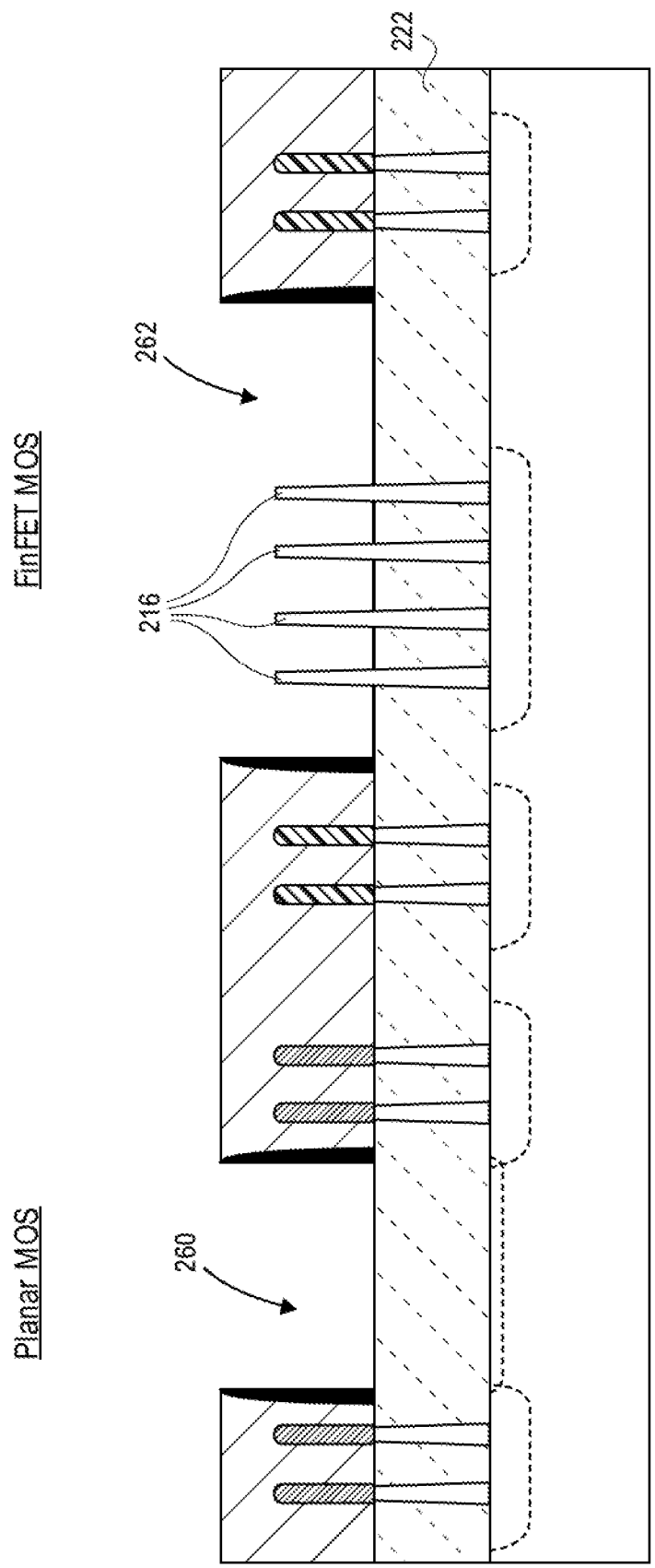

Referring to FIG. 2F, planar dummy gate structure 254 and non-planar dummy gate structure 256 are removed to form opening 260 and opening 262, respectively. Opening 262 exposes the plurality of fins 216.

Figure 2G:
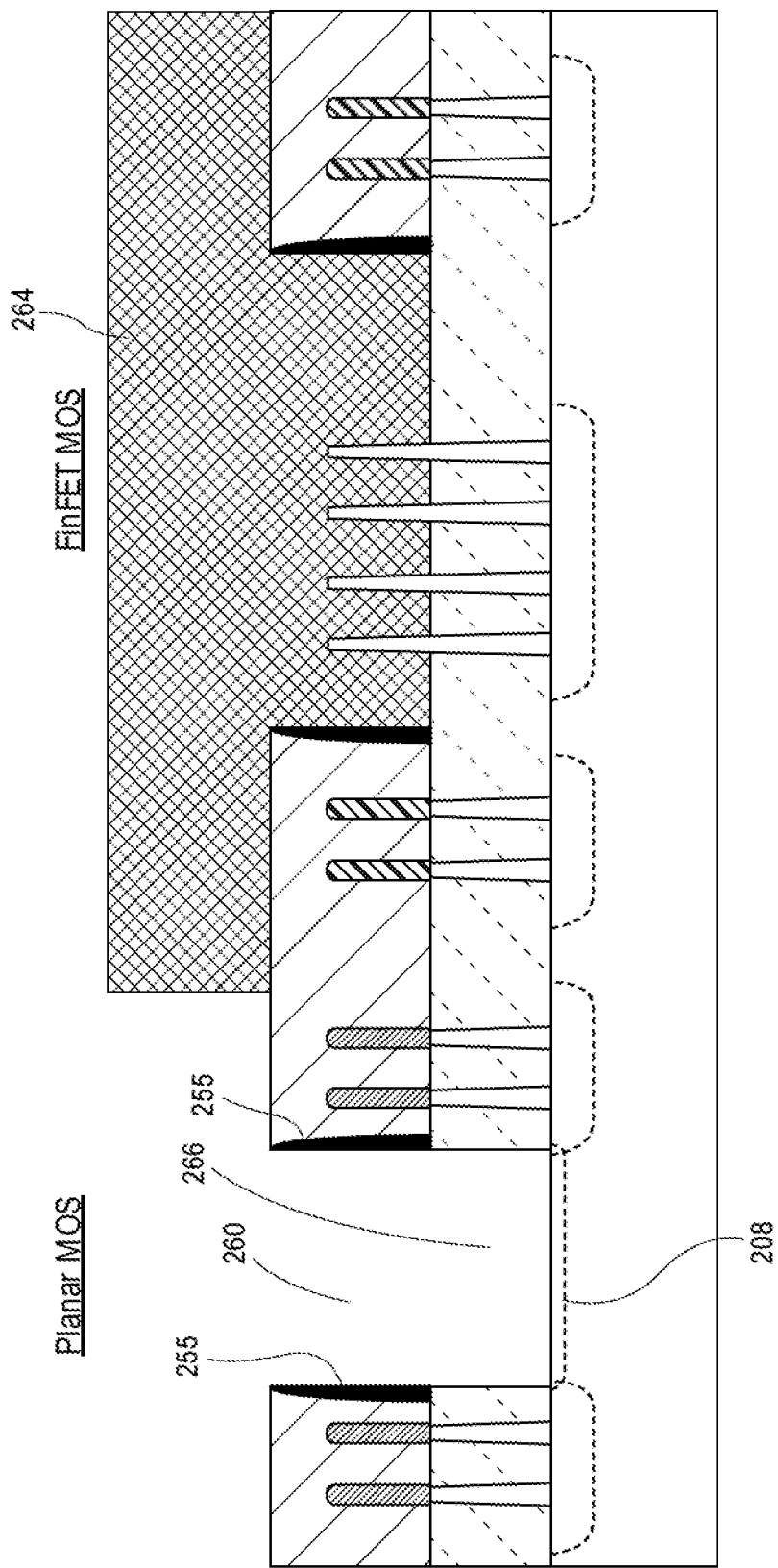

Referring to FIG. 2G, a masking layer 264 is formed over the structure of FIG. 2F. An opening is formed in the masking layer 264 in the planar MOS location. The portion of recessed dielectric layer 222 exposed by opening 260 is removed to form an opening 266 exposing substrate 202 and, if present, buried doped region 208.

Figure 2H:
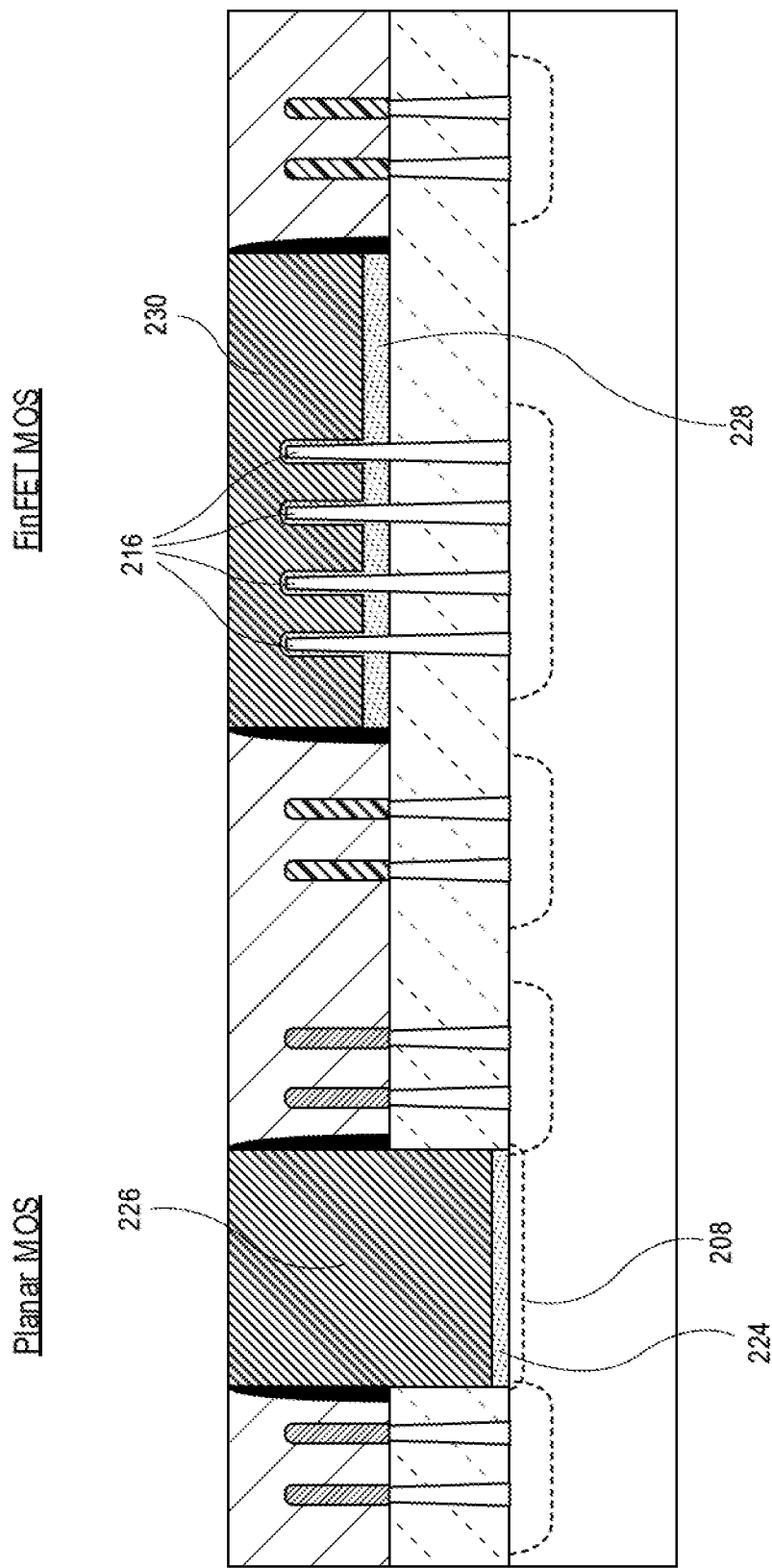

Referring to FIG. 2H, the masking layer 264 is removed to reform opening 262 over plurality of fins 216. A permanent planar gate structure is formed in openings 260/266 in the planar MOS location. The permanent planar gate structure includes a gate electrode 226 and a gate dielectric 224, such as a metal gate electrode and a high-k gate dielectric. A permanent non-planar gate structure is formed in opening 262 in the non-planar MOS location. The permanent non-planar gate structure includes a gate electrode 230 and a gate dielectric 228, such as a metal gate electrode and a high-k gate dielectric, which may be the same materials as the gate electrode 226 and a gate dielectric 224.

Referring to FIG. 3, further processing to form an integrated circuit structure 300 may include fabrication of a conductive source contact 232, a conductive gate contact 234, and a conductive drain contact 236 of a buried channel integrated circuit structure in the planar MOS location. The conductive source contact 232, conductive gate contact 234, and conductive drain contact 236 may be formed in an inter-layer dielectric layer 238. A conductive tap contact 240 may also be formed for a tap associated with the buried channel integrated circuit structure.

Referring again to FIG. 3, a conductive gate contact 242 of a non-planar integrated circuit structure is formed in the non-planar MOS location. A conductive tap contact 244 may also be formed for a tap associated with the non-planar integrated circuit structure. It is to be appreciated that source or drain structures (and associated trench contacts) for the non-planar integrated circuit structure are located into and out of the page.

With reference again to FIG. 3, in accordance with an embodiment of the present disclosure, an integrated circuit structure 300 includes a buried channel device (device in planar MOS region) and a non-planar device (device in FinFET MOS region). The buried channel device includes a source region 210A in a first fin structure above a substrate 202, a drain region 212A in a second fin structure above the substrate 202, and a first gate structure 226/224 between the source region 210A and the drain region 212A, the first gate structure 226/224 on a substantially planar region of the substrate 202 between the first fin structure and the second fin structure. The non-planar device includes a second gate structure 230/228 over a plurality of fins 216 above the substrate 202.

In an embodiment, the buried channel device is an N-type buried channel device, and the non-planar device is an N-type non-planar device. In an embodiment, the first gate structure 226/224 has an uppermost surface co-planar with an uppermost surface of the second gate structure 230/228.

It is to be appreciated that a planar or substantially planar substrate surface portion suitable for the fabrication of a buried channel gate structure between fins may be provided by one of several suitable approaches.

In a first aspect, it is to be appreciated that a fin trim process, where fin removal is performed, fins may be trimmed (effectively removed) during hardmask patterning or by physically removing the fin. In the former approach, a hardmask for fin patterning is patterned to include a region that provides a planar or substantially planar substrate surface portion between fins, where a buried channel gate structure is ultimately formed on the planar or substantially planar substrate surface portion. As an example, of the latter approach, FIGS. 4A-4C cross-sectional views representing various operations in a method of fabricating a plurality of semiconductor fins, in accordance with an embodiment of the present disclosure.

Figure 4A:
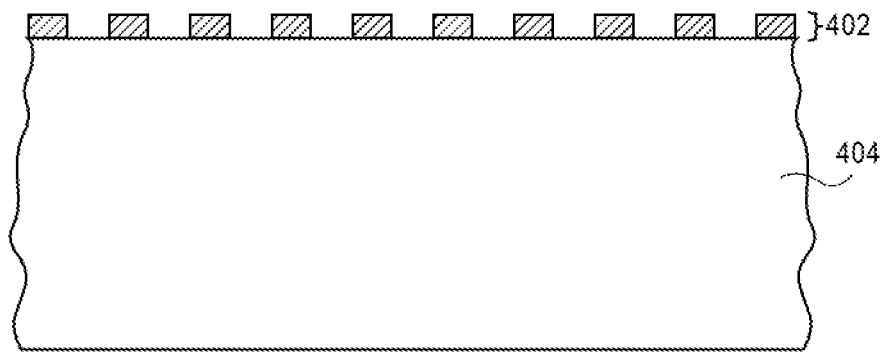
FIGS. 4A-4C cross-sectional views representing various operations in a method of fabricating a plurality of semiconductor fins, in accordance with an embodiment of the present disclosure.
Figure 4B:
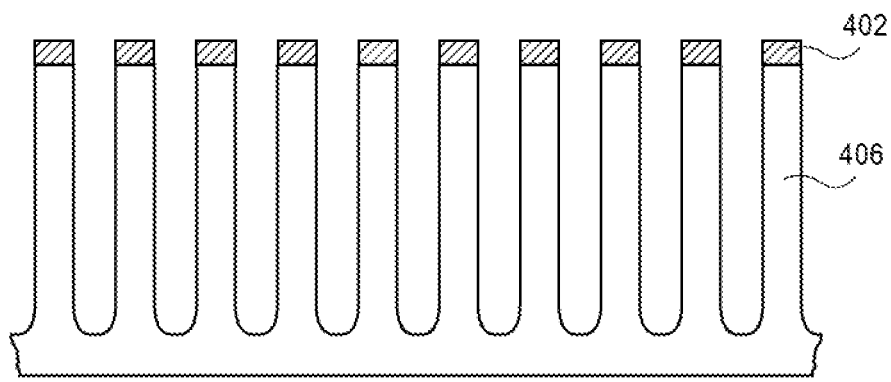
Figure 4C:
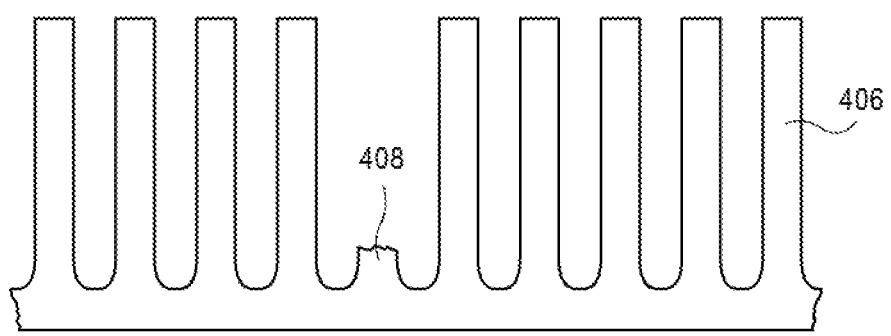

Referring to FIG. 4A, a patterned hardmask layer 402 is formed above a semiconductor layer 404, such as a bulk single crystalline silicon layer. Referring to FIG. 4B, fins 406 are then formed in the semiconductor layer 404, e.g., by a dry or plasma etch process. Referring to FIG. 4C, select fins 406 are removed, e.g., using a masking and etch process. In the example shown, one of the fins 406 is removed and may leave a remnant fin stub 408, as is depicted in FIG. 4C.

In such a "fin trim last" approach, the hardmask 402 is patterned as whole to provide a grating structure without removal or modification of individual features. The fin population is not modified until after fins are fabricated.

In accordance with an embodiment of the present disclosure, the substrate region at location 408 provides a planar or substantially planar substrate surface portion between fins. A buried channel gate structure is ultimately formed on the planar or substantially planar substrate surface portion at location 408. As such, in an embodiment, a "planar" gate structure of a buried channel device is fabricated on a "stub" of a removed fin.

In another aspect, pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

Figure 5A:
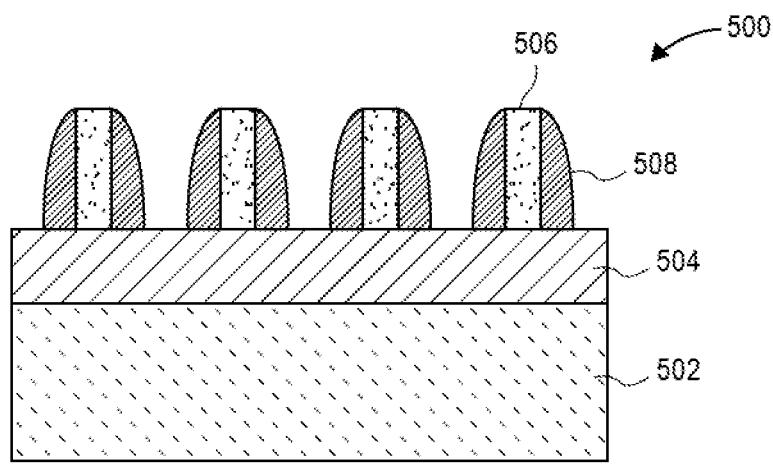
FIG. 5A illustrates a cross-sectional view of a starting structure following deposition, but prior to patterning, of a hardmask material layer formed on an interlayer dielectric (ILD) layer, in accordance with an embodiment of the present disclosure.
Figure 5B:
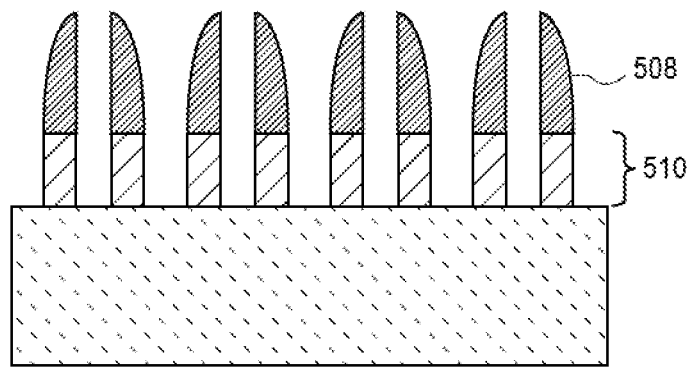
FIG. 5B illustrates a cross-sectional view of the structure of FIG. 5A following patterning of the hardmask layer by pitch halving, in accordance with an embodiment of the present disclosure.

In a first example, pitch halving can be implemented to double the line density of a fabricated grating structure. FIG. 5A illustrates a cross-sectional view of a starting structure following deposition, but prior to patterning, of a hardmask material layer formed on an interlayer dielectric (ILD) layer, in accordance with an embodiment of the present disclosure. FIG. 5B illustrates a cross-sectional view of the structure of FIG. 5A following patterning of the hardmask layer by pitch halving, in accordance with an embodiment of the present disclosure.

Referring to FIG. 5A, a starting structure 500 has a hardmask material layer 504 formed on an interlayer dielectric (ILD) layer 502. A patterned mask 506 is disposed above the hardmask material layer 504. The patterned mask 506 has spacers 508 formed along sidewalls of features (lines) thereof, on the hardmask material layer 504.

Referring to FIG. 5B, the hardmask material layer 504 is patterned in a pitch halving approach. Specifically, the patterned mask 506 is first removed. The resulting pattern of the spacers 508 has double the density, or half the pitch or the features of the mask 506. The pattern of the spacers 508 is transferred, e.g., by an etch process, to the hardmask material layer 504 to form a patterned hardmask 510, as is depicted in FIG. 5B. In one such embodiment, the patterned hardmask 510 is formed with a grating pattern having unidirectional lines. The grating pattern of the patterned hardmask 510 may be a tight pitch grating structure. For example, the tight pitch may not be achievable directly through selected lithography techniques. Even further, although not shown, the original pitch may be quartered by a second round of spacer mask patterning. Accordingly, the grating-like pattern of the patterned hardmask 510 of Figure 5B may have hardmask lines spaced at a constant pitch and having a constant width relative to one another. The dimensions achieved may be far smaller than the critical dimension of the lithographic technique employed.

Accordingly, for either front-end of line (FEOL) or back-end of line (BEOL), or both, integrations schemes, a blanket film may be patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented. In any case, in an embodiment, a gridded layout may be fabricated by a selected lithography approach, such as 193 nm immersion lithography (193$i$). Pitch division may be implemented to increase the density of lines in the gridded layout by a factor of 'n'. Gridded layout formation with 193$i$ lithography plus pitch division by a factor of 'n' can be designated as 193$i$+P/n Pitch Division. In one such embodiment, 193 nm immersion scaling can be extended for many generations with cost effective pitch division.

In the manufacture of integrated circuit devices, multi-gate transistors, such as tri-gate transistors, have become more prevalent as device dimensions continue to scale down. Tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

In accordance with one or more embodiments of the present disclosure, a pitch quartering approach is implemented for patterning a semiconductor layer to form semiconductor fins. In one or more embodiments, a merged fin pitch quartering approach is implemented.

Figure 6A:
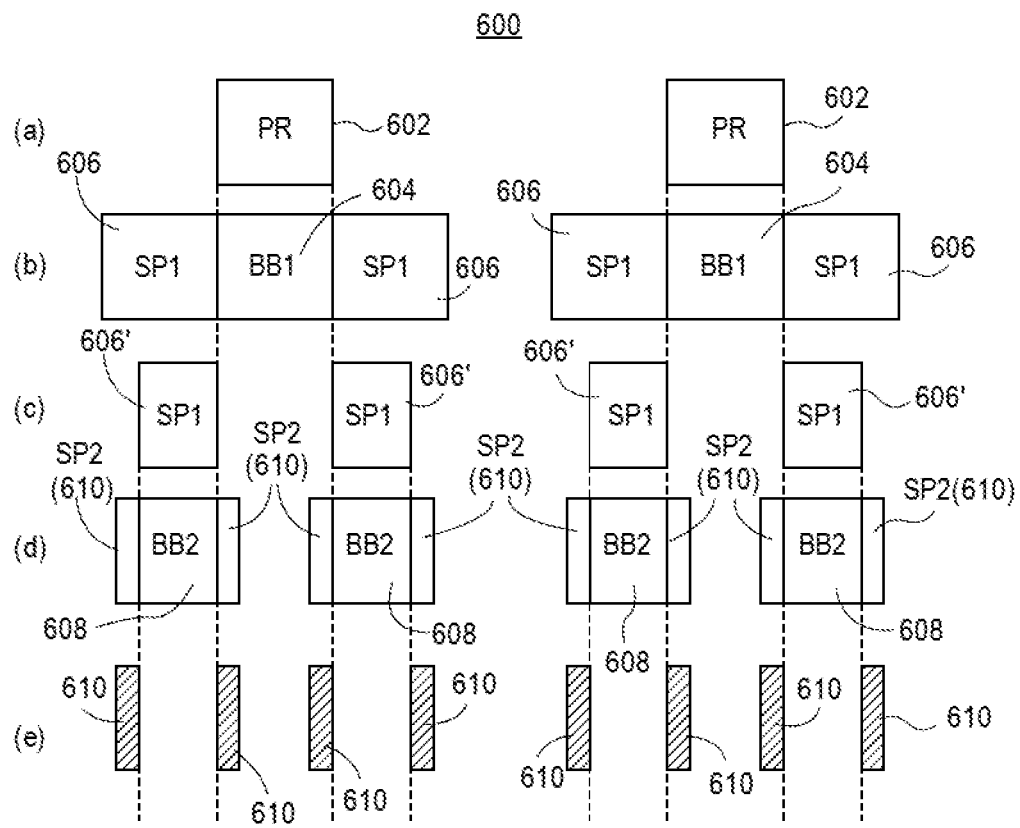
FIG. 6A is a schematic of a pitch quartering approach used to fabricate semiconductor fins, in accordance with an embodiment of the present disclosure.
Figure 6B:
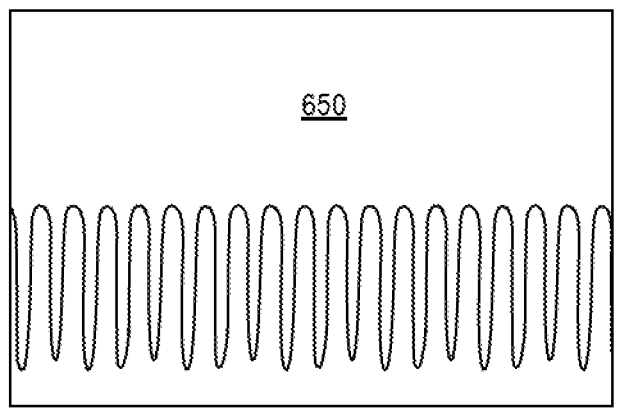
FIG. 6B illustrates a cross-sectional view of semiconductor fins fabricated using a pitch quartering approach, in accordance with an embodiment of the present disclosure.

FIG. 6A is a schematic of a pitch quartering approach 600 used to fabricate semiconductor fins, in accordance with an embodiment of the present disclosure. FIG. 6B illustrates a cross-sectional view of semiconductor fins fabricated using a pitch quartering approach, in accordance with an embodiment of the present disclosure.

Referring to FIG. 6A, at operation (a), a photoresist layer (PR) is patterned to form photoresist features 602. The photoresist features 602 may be patterned using standard lithographic processing techniques, such as 193 immersion lithography. At operation (b), the photoresist features 602 are used to pattern a material layer, such as an insulating or dielectric hardmask layer, to form first backbone (BB1) features 604. First spacer (SP1) features 606 are then formed adjacent the sidewalls of the first backbone features 604. At operation (c), the first backbone features 604 are removed to leave only the first spacer features 606 remaining. Prior to or during the removal of the first backbone features 604, the first spacer features 606 may be thinned to formed thinned first spacer features 606', as is depicted in FIG. 6A. At operation (d), the first spacer features 606 or the thinned first spacer features 606' are used to pattern a material layer, such as an insulating or dielectric hardmask layer, to form second backbone (BB2) features 608. Second spacer (SP2) features 610 are then formed adjacent the sidewalls of the second backbone features 608. At operation (e), the second backbone features 608 are removed to leave only the second spacer features 610 remaining. The remaining second spacer features 610 may then be used to pattern a semiconductor layer to provide a plurality of semiconductor fins having a pitch quartered dimension relative to the initial patterned photoresist features 602. As an example, referring to FIG. 6B, a plurality of semiconductor fins 650, such as silicon fins formed from a bulk silicon layer, is formed using the second spacer features 610 as a mask for the patterning, e.g., a dry or plasma etch patterning. In the example of FIG. 6B, the plurality of semiconductor fins 650 has essentially a same pitch and spacing throughout.

Figure 7A:
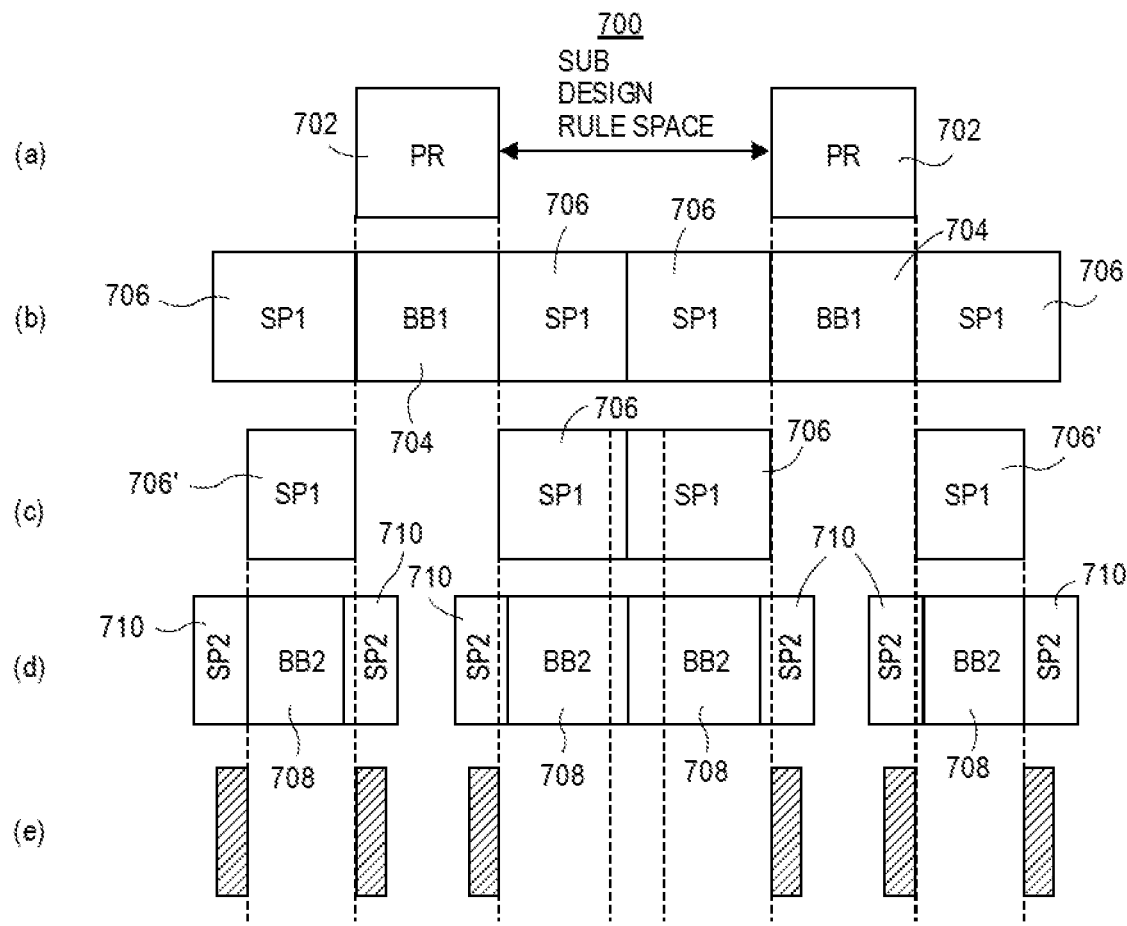
FIG. 7A is a schematic of a merged fin pitch quartering approach used to fabricate semiconductor fins, in accordance with an embodiment of the present disclosure.
Figure 7B:
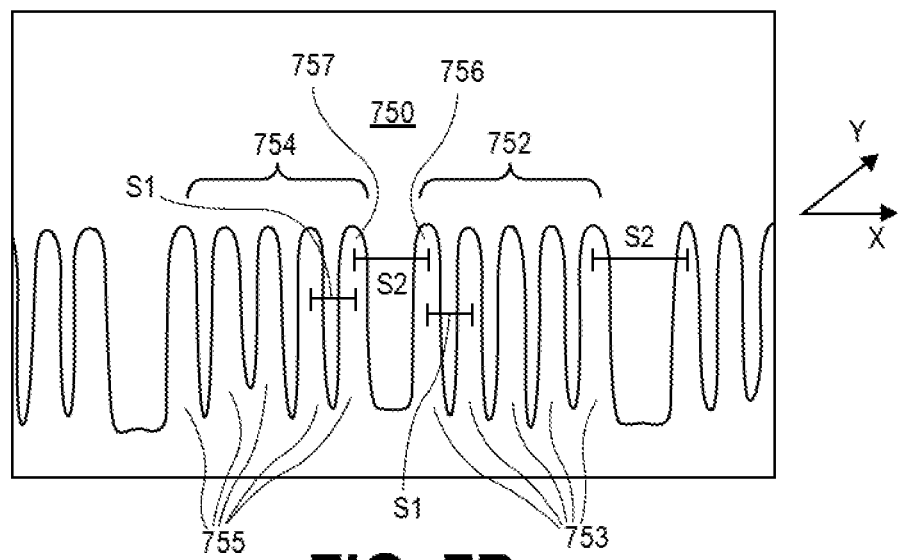
FIG. 7B illustrates a cross-sectional view of semiconductor fins fabricated using a merged fin pitch quartering approach, in accordance with an embodiment of the present disclosure.

It is to be appreciated that the spacing between initially patterned photoresist features can be modified to vary the structural result of the pitch quartering process. In an example, FIG. 7A is a schematic of a merged fin pitch quartering approach 700 used to fabricate semiconductor fins, in accordance with an embodiment of the present disclosure. FIG. 7B illustrates a cross-sectional view of semiconductor fins fabricated using a merged fin pitch quartering approach, in accordance with an embodiment of the present disclosure.

Referring to FIG. 7A, at operation (a), a photoresist layer (PR) is patterned to form photoresist features 702. The photoresist features 702 may be patterned using standard lithographic processing techniques, such as 193 immersion lithography, but at a spacing that may ultimately interfere with design rules (e.g., a spacing referred to as a sub design rule space). At operation (b), the photoresist features 702 are used to pattern a material layer, such as an insulating or dielectric hardmask layer, to form first backbone (BB1) features 704. First spacer (SP1) features 706 are then formed adjacent the sidewalls of the first backbone features 704. However, in contrast to the scheme illustrated in FIG. 6A, some of the adjacent first spacer features 706 are merged spacer features as a result of the tighter photoresist features 702. At operation (c), the first backbone features 704 are removed to leave only the first spacer features 706 remaining. Prior to or during the removal of the first backbone features 704, some of the first spacer features 706 may be thinned to formed thinned first spacer features 706', as is depicted in FIG. 7A. At operation (d), the first spacer features 706 and the thinned first spacer features 706' are used to pattern a material layer, such as an insulating or dielectric hardmask layer, to form second backbone (BB2) features 708. Second spacer (SP2) features 710 are then formed adjacent the sidewalls of the second backbone features 708. However, in locations where (BB2) features 708 are merged features, such as at the central (BB2) features 708 of FIG. 7A, second spacers are not formed. At operation (e), the second backbone features 708 are removed to leave only the second spacer features 710 remaining. The remaining second spacer features 710 may then be used to pattern a semiconductor layer to provide a plurality of semiconductor fins having a pitch quartered dimension relative to the initial patterned photoresist features 702.

As an example, referring to FIG. 7B, a plurality of semiconductor fins 750, such as silicon fins formed from a bulk silicon layer, is formed using the second spacer features 710 as a mask for the patterning, e.g., a dry or plasma etch patterning. In the example of FIG. 7B, however, the plurality of semiconductor fins 750 has a varied pitch and spacing. Such a merged fin spacer patterning approach may be implemented to essentially eliminate the presence of a fin in certain locations of a pattern of a plurality of fins. Accordingly, merging the first spacer features 706 in certain locations allows for the fabrication of six or four fins with based on two first backbone features 704, which typically generate eight fins, as described in association with FIGS. 6A and 6B. In one example, in board fins have a tighter pitch than would normally be allowed by creating the fins at uniform pitch and then cutting the unneeded fins, although the latter approach may still be implemented in accordance with embodiments described herein.

In an exemplary embodiment, referring to FIG. 7B, an integrated circuit structure, a first plurality of semiconductor fins 752 has a longest dimension along a first direction (y, into the page). Adjacent individual semiconductor fins 753 of the first plurality of semiconductor fins 752 are spaced apart from one another by a first amount (S1) in a second direction (x) orthogonal to the first direction (y). A second plurality of semiconductor fins 754 has a longest dimension along the first direction (y). Adjacent individual semiconductor fins 755 of the second plurality of semiconductor fins 754 are spaced apart from one another by the first amount (S1) in the second direction. Closest semiconductor fins 756 and 757 of the first plurality of semiconductor fins 752 and the second plurality of semiconductor fins 754, respectively, are spaced apart from one another by a second amount (S2) in the second direction (x). In an embodiment, the second amount (S2) is more than two times but less than three times greater than the first amount (S1).

In one embodiment, the first plurality of semiconductor fins 752 and the second plurality of semiconductor fins 754 include silicon. In one embodiment, the first plurality of semiconductor fins 752 and the second plurality of semiconductor fins 754 are continuous with an underlying monocrystalline silicon substrate. In one embodiment, individual ones of the first plurality of semiconductor fins 752 and the second plurality of semiconductor fins 754 have outwardly tapering sidewalls along the second direction (x) from a top to a bottom of individual ones of the first plurality of semiconductor fins 752 and the second plurality of semiconductor fins 754. In one embodiment, the first plurality of semiconductor fins 752 has exactly five semiconductor fins, and the second plurality of semiconductor fins 754 has exactly five semiconductor fins.

In another exemplary embodiment, referring to FIGS. 7A and 7B, a method of fabricating an integrated circuit structure includes forming a first primary backbone structure 704 (left BB1) and a second primary backbone structure 704 (right BB1). Primary spacer structures 706 are formed adjacent sidewalls of the first primary backbone structure 704 (left BB1) and the second primary backbone structure 704 (right BB1). Primary spacer structures 706 between the first primary backbone structure 704 (left BB1) and the second primary backbone structure 704 (right BB1) are merged. The first primary backbone structure (left BB1) and the second primary backbone structure (right BB1) are removed, and first, second, third and fourth secondary backbone structures 708 are provided. The second and third secondary backbone structures (e.g., the central pair of the secondary backbone structures 708) are merged. Secondary spacer structures 710 are formed adjacent sidewalls of the first, second, third and fourth secondary backbone structures 708. The first, second, third and fourth secondary backbone structures 708 are then removed. A semiconductor material is then patterned with the secondary spacer structures 710 to form semiconductor fins 750 in the semiconductor material.

In one embodiment, the first primary backbone structure 704 (left BB1) and the second primary backbone structure 704 (right BB1) are patterned with a sub-design rule spacing between the first primary backbone structure and the second primary backbone structure. In one embodiment, the semiconductor material includes silicon. In one embodiment, individual ones of the semiconductor fins 750 have outwardly tapering sidewalls along the second direction (x) from a top to a bottom of individual ones of the semiconductor fins 750. In one embodiment, the semiconductor fins 750 are continuous with an underlying monocrystalline silicon substrate. In one embodiment, patterning the semiconductor material with the secondary spacer structures 710 includes forming a first plurality of semiconductor fins 752 having a longest dimension along a first direction (y), where adjacent individual semiconductor fins of the first plurality of semiconductor fins 752 are spaced apart from one another by a first amount (51) in a second direction (x) orthogonal to the first direction (y). A second plurality of semiconductor fins 754 is formed having a longest dimension along the first direction (y), where adjacent individual semiconductor fins of the second plurality of semiconductor fins 754 are spaced apart from one another by the first amount (S1) in the second direction (x). Closest semiconductor fins 756 and 757 of the first plurality of semiconductor fins 752 and the second plurality of semiconductor fins 754, respectively, are spaced apart from one another by a second amount (S2) in the second direction (x). In an embodiment, the second amount (S2) is greater than the first amount (S1). In one such embodiment, the second amount (S2) is at least twice the first amount (S1). In another such embodiment, the second amount (S2) is more than two times but less than three times greater than the first amount (S1). In an embodiment, the first plurality of semiconductor fins 752 has exactly five semiconductor fins, and the second plurality of semiconductor fins 754 has exactly five semiconductor fins, as is depicted in FIG. 7B.

In accordance with an embodiment of the present disclosure, the substrate region in location S2 provides a planar or substantially planar substrate surface portion between fins. A buried channel gate structure is ultimately formed on the planar or substantially planar substrate surface portion at location S2.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate. Although not depicted as such, gate structures described herein may be recessed and have a gate insulating cap formed thereon.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, other approaches typically involve an additional lithography process with tight registration of a lithographic contact pattern to an existing gate pattern in combination with selective contact etches. For example, another process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) technology node sub-10 nanometer (10 nm) technology node.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
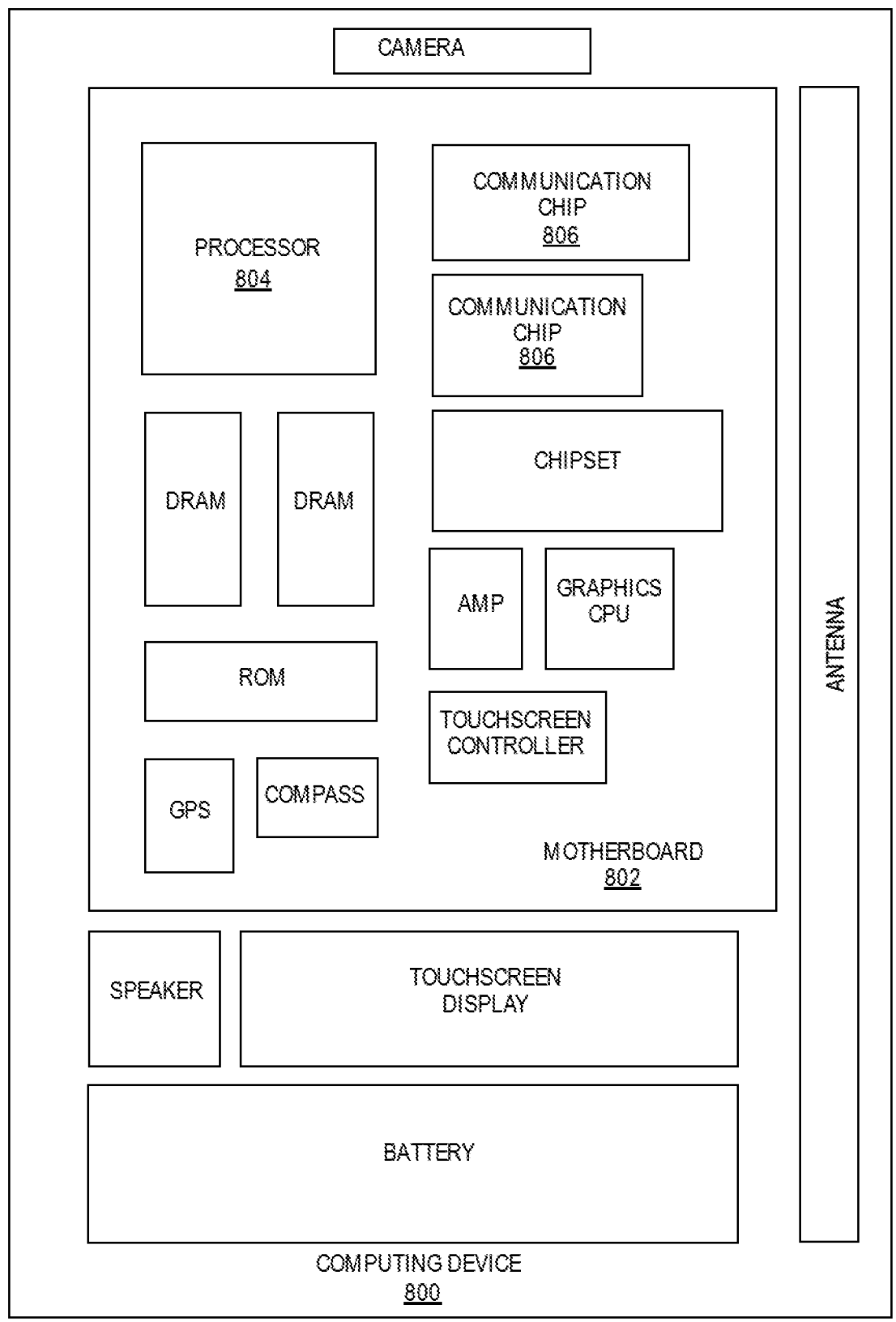
FIG. 8 illustrates a computing device in accordance with one implementation of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 806 also includes an integrated circuit die packaged within the communication chip 806. In accordance with another implementation of the disclosure, the integrated circuit die of the communication chip is built in accordance with implementations of the disclosure.

In further implementations, another component housed within the computing device 800 may contain an integrated circuit die built in accordance with implementations of embodiments of the disclosure.

In various embodiments, the computing device 800 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
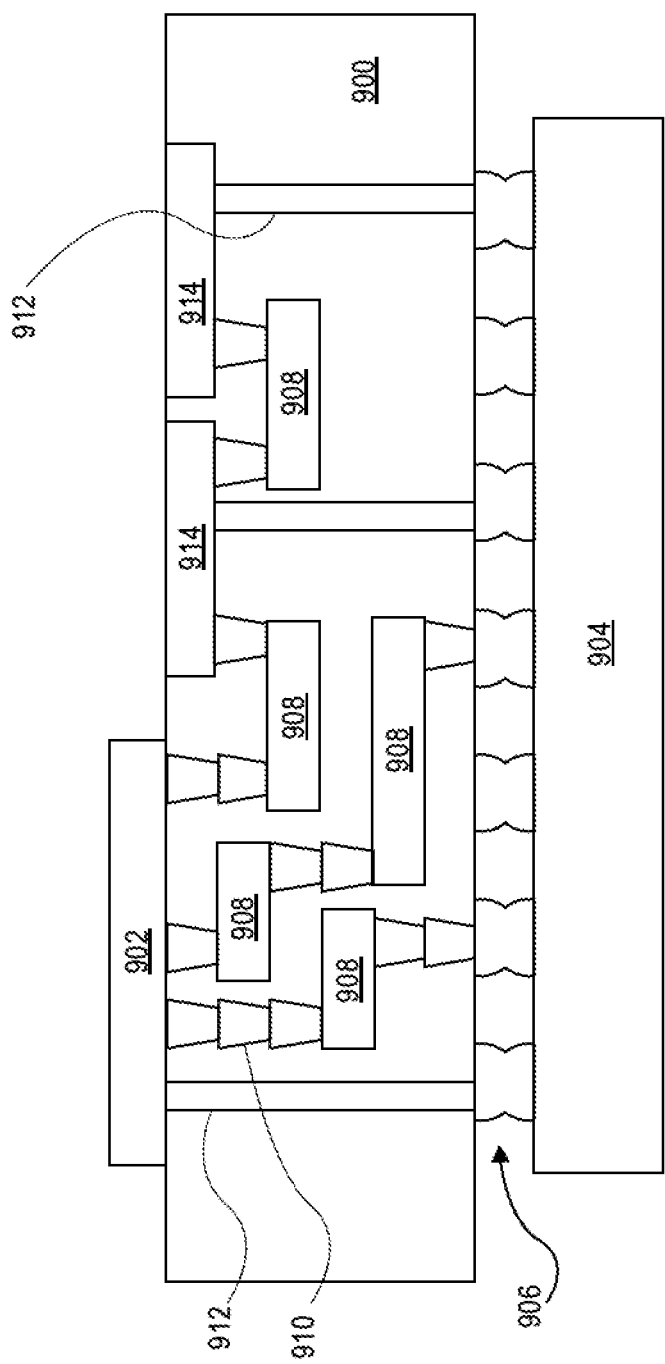
FIG. 9 illustrates an interposer that includes one or more embodiments of the disclosure.

FIG. 9 illustrates an interposer 900 that includes one or more embodiments of the disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the disclosure, apparatuses or processes disclosed herein may be used in the fabrication of interposer 900 or in the fabrication of components included in the interposer 900.

Figure 10:
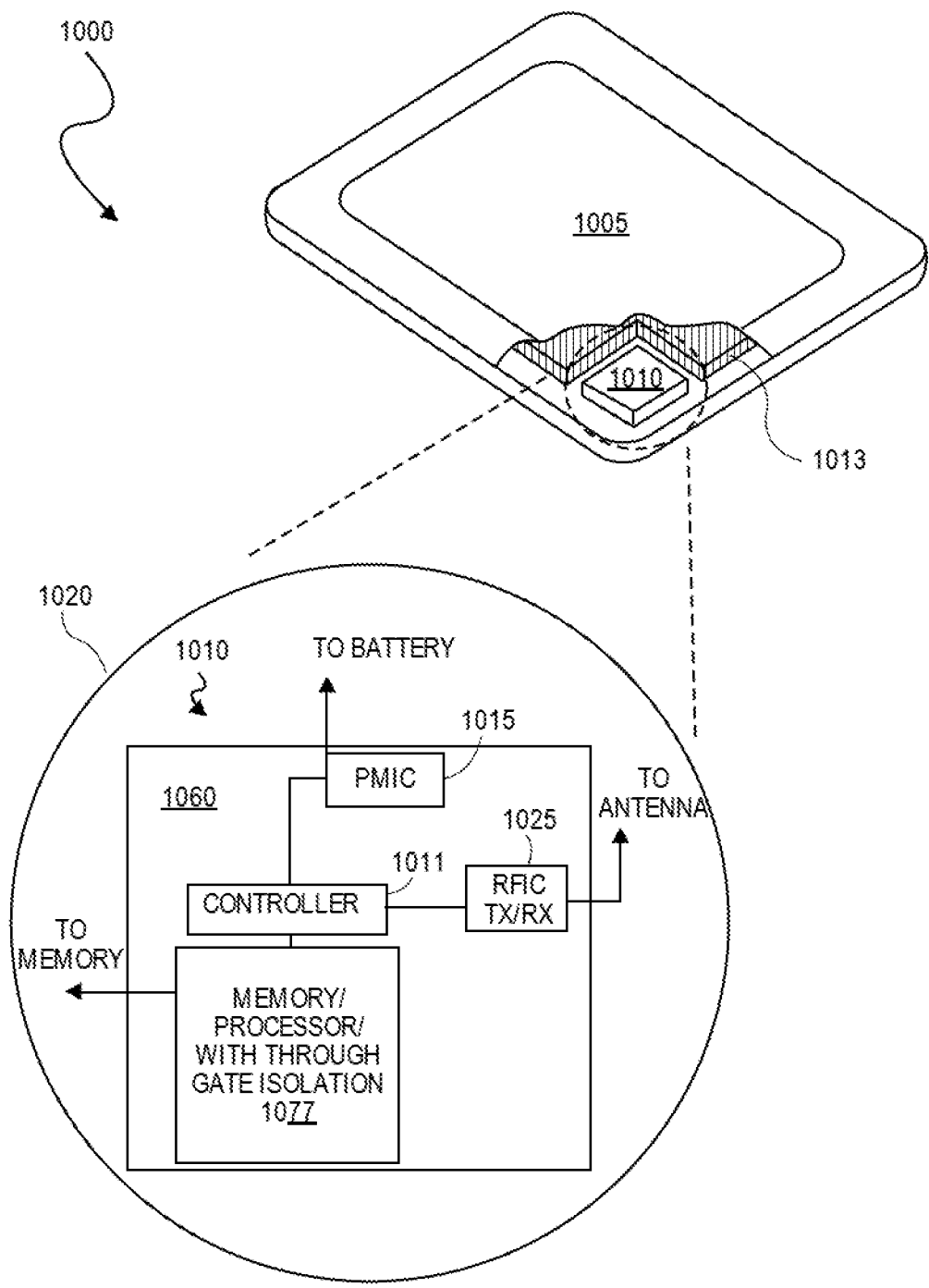
FIG. 10 is an isometric view of a mobile computing platform employing an IC fabricated according to one or more processes described herein or including one or more features described herein, in accordance with an embodiment of the present disclosure.

FIG. 10 is an isometric view of a mobile computing platform 1000 employing an integrated circuit (IC) fabricated according to one or more processes described herein or including one or more features described herein, in accordance with an embodiment of the present disclosure.

The mobile computing platform 1000 may be any portable device configured for each of electronic data display, electronic data processing, and wireless electronic data transmission. For example, mobile computing platform 1000 may be any of a tablet, a smart phone, laptop computer, etc. and includes a display screen 1005 which in the exemplary embodiment is a touchscreen (capacitive, inductive, resistive, etc.), a chip-level (SoC) or package-level integrated system 1010, and a battery 1013. As illustrated, the greater the level of integration in the system 1010 enabled by higher transistor packing density, the greater the portion of the mobile computing platform 1000 that may be occupied by the battery 1013 or non-volatile storage, such as a solid state drive, or the greater the transistor gate count for improved platform functionality. Similarly, the greater the carrier mobility of each transistor in the system 1010, the greater the functionality. As such, techniques described herein may enable performance and form factor improvements in the mobile computing platform 1000.

The integrated system 1010 is further illustrated in the expanded view 1020. In the exemplary embodiment, packaged device 1077 includes at least one memory chip (e.g., RAM), or at least one processor chip (e.g., a multi-core microprocessor and/or graphics processor) fabricated according to one or more processes described herein or including one or more features described herein. The packaged device 1077 is further coupled to the board 1060 along with one or more of a power management integrated circuit (PMIC) 1015, RF (wireless) integrated circuit (RFIC) 1025 including a wideband RF (wireless) transmitter and/or receiver (e.g., including a digital baseband and an analog front end module further including a power amplifier on a transmit path and a low noise amplifier on a receive path), and a controller thereof 1011. Functionally, the PMIC 1015 performs battery power regulation, DC-to-DC conversion, etc., and so has an input coupled to the battery 1013 and with an output providing a current supply to all the other functional modules. As further illustrated, in the exemplary embodiment, the RFIC 1025 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1077 or within a single IC (SoC) coupled to the package substrate of the packaged device 1077.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 11:
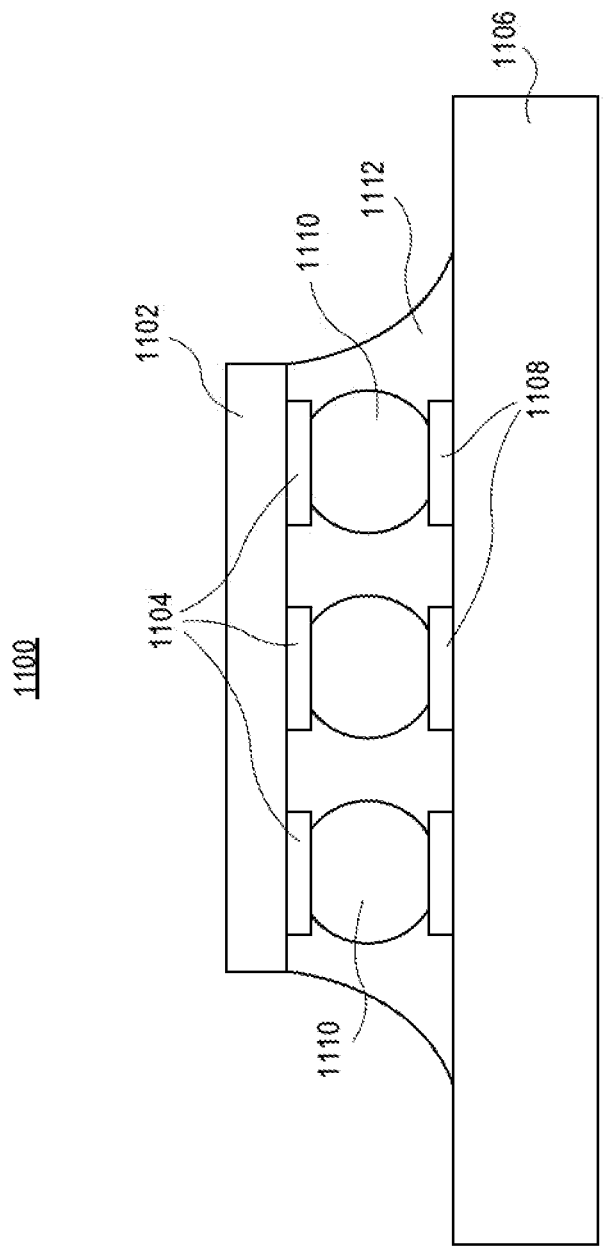
FIG. 11 illustrates a cross-sectional view of a flip-chip mounted die, in accordance with an embodiment of the present disclosure.

FIG. 11 illustrates a cross-sectional view of a flip-chip mounted die, in accordance with an embodiment of the present disclosure.

Referring to FIG. 11, an apparatus 1100 includes a die 1102 such as an integrated circuit (IC) fabricated according to one or more processes described herein or including one or more features described herein, in accordance with an embodiment of the present disclosure. The die 1102 includes metallized pads 1104 thereon. A package substrate 1106, such as a ceramic or organic substrate, includes connections 1108 thereon. The die 1102 and package substrate 1106 are electrically connected by solder balls 1110 coupled to the metallized pads 1104 and the connections 1108. An underfill material 1112 surrounds the solder balls 1110.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include advanced integrated circuit structure fabrication and, in particular, buried channel structures integrated with non-planar structures.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a first fin structure and a second fin structure above a substrate. A gate structure is on a portion of the substrate directly between the first fin structure and the second fin structure. A source region is in the first fin structure. A drain region is in the second fin structure.

Example embodiment 2: The integrated circuit structure of example embodiment 1, wherein the first fin structure includes a first pair of silicon fins, and wherein the second fin structure includes a second pair of silicon fins.

Example embodiment 3: The integrated circuit structure of example embodiment 1 or 2, wherein the first fin structure is over a first well region in the substrate, and the second fin structure is over a second well region in the substrate.

Example embodiment 4: The integrated circuit structure of example embodiment 1, 2 or 3, wherein the gate structure is over a buried doped region in the substrate.

Example embodiment 5: The integrated circuit structure of example embodiment 4, wherein the first well region, the second well region, and the buried doped region have an N-type conductivity.

Example embodiment 6: The integrated circuit structure of example embodiment 1, 2, 3, 4 or 5, further including a third fin structure above the substrate, the third fin structure adjacent the second fin structure.

Example embodiment 7: The integrated circuit structure of example embodiment 6, wherein the third fin structure includes a pair of silicon fins.

Example embodiment 8: The integrated circuit structure of example embodiment 6 or 7, wherein the third fin structure is over a well region in the substrate, the well region having a P-type conductivity.

Example embodiment 9: The integrated circuit structure of example embodiment 6, 7 or 8, further including a tap diffusion region in the third fin structure.

Example embodiment 10: An integrated circuit structure includes a buried channel device having a source region in a first fin structure above a substrate, a drain region in a second fin structure above the substrate, and a first gate structure between the source region and the drain region, the first gate structure on a substantially planar region of the substrate between the first fin structure and the second fin structure. The integrated circuit structure also includes a non-planar device having a second gate structure over a plurality of fins above the substrate.

Example embodiment 11: The integrated circuit structure of example embodiment 10, wherein the buried channel device is an N-type buried channel device, and the non-planar device is an N-type non-planar device.

Example embodiment 12: The integrated circuit structure of example embodiment 10 or 11, wherein the first gate structure has an uppermost surface co-planar with an uppermost surface of the second gate structure.

Example embodiment 13: A computing device includes a board, and a component coupled to the board. The component includes an integrated circuit structure includes a first fin structure and a second fin structure above a substrate. A gate structure is on a portion of the substrate directly between the first fin structure and the second fin structure. A source region is in the first fin structure. A drain region is in the second fin structure.

Example embodiment 14: The computing device of example embodiment 13, further including a memory coupled to the board.

Example embodiment 15: The computing device of example embodiment 13 or 14, further including a communication chip coupled to the board.

Example embodiment 16: The computing device of example embodiment 13, 14 or 15, further including a camera coupled to the board.

Example embodiment 17: The computing device of example embodiment 13, 14, 15 or 16, further including a battery coupled to the board.

Example embodiment 18: The computing device of example embodiment 13, 14, 15, 16 or 17, further including an antenna coupled to the board.

Example embodiment 19: The computing device of example embodiment 13, 14, 15, 16, 17 or 18, wherein the component is a packaged integrated circuit die.

Example embodiment 20: The computing device of example embodiment 13, 14, 15, 16, 17, 18 or 19, wherein the component is selected from the group consisting of a processor, a communications chip, and a digital signal processor.

Example embodiment 21: The computing device of example embodiment 13, 14, 15, 16, 17, 18, 19 or 20, wherein the computing device is selected from the group consisting of a mobile phone, a laptop, a desk top computer, a server, and a set-top box.

What is claimed is:

1. An integrated circuit structure, comprising:
a first fin structure and a second fin structure protruding through a dielectric layer above a semiconductor substrate, the dielectric layer having an uppermost surface;
a gate structure directly on a portion of the semiconductor substrate, the portion of the semiconductor substrate between the first fin structure and the second fin structure, the gate structure comprising a gate electrode having a bottommost surface below the uppermost surface of the dielectric layer;
a source region in the first fin structure; and
a drain region in the second fin structure.

2. The integrated circuit structure of claim 1, wherein the first fin structure comprises a first pair of silicon fins, and wherein the second fin structure comprises a second pair of silicon fins.

3. The integrated circuit structure of claim 1, wherein the first fin structure is over a first well region in the semiconductor substrate, and the second fin structure is over a second well region in the semiconductor substrate.

4. The integrated circuit structure of claim 3, wherein the gate structure is over a buried doped region in the semiconductor substrate.

5. The integrated circuit structure of claim 4, wherein the first well region, the second well region, and the buried doped region have an N-type conductivity.

6. The integrated circuit structure of claim 1, further comprising:
a third fin structure above the semiconductor substrate, the third fin structure adjacent the second fin structure.

7. The integrated circuit structure of claim 6, wherein the third fin structure comprises a pair of silicon fins.

8. The integrated circuit structure of claim 6, wherein the third fin structure is over a well region in the semiconductor substrate, the well region having a P- type conductivity.

9. The integrated circuit structure of claim 6, further comprising a tap diffusion region in the third fin structure.

10. An integrated circuit structure, comprising:
a buried channel device, comprising:
a source region in a first fin structure protruding through a dielectric layer above a semiconductor substrate, the dielectric layer having an uppermost surface;
a drain region in a second fin structure protruding through the dielectric layer above the semiconductor substrate; and
a first gate structure between the source region and the drain region, the first gate structure directly on a substantially planar region of the semiconductor substrate between the first fin structure and the second fin structure, the gate structure comprising a gate electrode having a bottommost surface below the uppermost surface of the dielectric layer; and
a non-planar device comprising a second gate structure over a plurality of fins above the semiconductor substrate.

11. The integrated circuit structure of claim 10, wherein the buried channel device is an N-type buried channel device, and the non-planar device is an N-type non-planar device.

12. The integrated circuit structure of claim 10, wherein the first gate structure has an uppermost surface co-planar with an uppermost surface of the second gate structure.

13. A computing device, comprising:
a board; and
a component coupled to the board, the component including an integrated circuit structure, comprising:
a first fin structure and a second fin structure protruding through a dielectric layer above a semiconductor substrate, the dielectric layer having an uppermost surface;
a gate structure directly on a portion of the semiconductor substrate, the portion of the semiconductor substrate between the first fin structure and the second fin structure, the gate structure comprising a gate electrode having a bottommost surface below the uppermost surface of the dielectric layer;
a source region in the first fin structure; and
a drain region in the second fin structure.

14. The computing device of claim 13, further comprising:
a memory coupled to the board.

15. The computing device of claim 13, further comprising:
a communication chip coupled to the board.

16. The computing device of claim 13, further comprising:
a camera coupled to the board.

17. The computing device of claim 13, further comprising:
a battery coupled to the board.

18. The computing device of claim 13, further comprising:
an antenna coupled to the board.

19. The computing device of claim 13, wherein the component is a packaged integrated circuit die.

20. The computing device of claim 13, wherein the component is selected from the group consisting of a processor, a communications chip, and a digital signal processor.

21. The computing device of claim 13, wherein the computing device is selected from the group consisting of a mobile phone, a laptop, a desk top computer, a server, and a set-top box.

\* \* \* \* \*